(12) United States Patent
Kondo et al.

(10) Patent No.: US 10,374,057 B2
(45) Date of Patent: *Aug. 6, 2019

(54) METHOD OF FORMING METAL CONTACTS IN THE BARRIER LAYER OF A GROUP III-N HEMT

(71) Applicant: Texas Instruments Incorporated, Dallas, TX (US)

(72) Inventors: Yoshikazu Kondo, Dallas, TX (US); Shoji Wada, Plano, TX (US); Hiroshi Yamasaki, Richardson, TX (US); Masahiro Iwamoto, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/730,853

(22) Filed: Oct. 12, 2017

(65) Prior Publication Data

US 2018/0033865 A1  Feb. 1, 2018

Related U.S. Application Data

(60) Division of application No. 15/237,041, filed on Aug. 15, 2016, now Pat. No. 9,818,839, which is a
(Continued)

(51) Int. Cl.
*H01L 21/306* (2006.01)
*H01L 29/201* (2006.01)
(Continued)

(52) U.S. Cl.
CPC ...... *H01L 29/66462* (2013.01); *H01L 21/283* (2013.01); *H01L 21/28575* (2013.01);
(Continued)

(58) Field of Classification Search
CPC .......... H01L 29/66462; H01L 29/2003; H01L 29/41766; H01L 29/452; H01L 21/283; H01L 21/28575; H01L 21/30621
See application file for complete search history.

(56) References Cited

U.S. PATENT DOCUMENTS

| 5,654,214 A | 8/1997 | Frijlink et al. |
| 8,124,505 B1 | 2/2012 | Burnham et al. |
| (Continued) | | |

FOREIGN PATENT DOCUMENTS

| CN | 102789982 A | 11/2012 |
| CN | 102916043 A | 2/2013 |
| (Continued) | | |

OTHER PUBLICATIONS

State Intellectual Property Office of PRC, date of Issue: Nov. 23, 2017, Appl. No. 201480031743.3, Document Series No. 2017112001583480.
(Continued)

*Primary Examiner* — Mary A Wilczewski
(74) *Attorney, Agent, or Firm* — Jacqueline J. Garner; Charles A. Brill; Frank D. Cimino

(57) ABSTRACT

Metal contact openings are etched in the barrier layer of a group III-N HEMT with a first gas combination that etches down into the barrier layer, and a second gas combination that etches further down into the barrier layer to a depth that lies above the top surface of a channel layer that touches and lies below the barrier layer.

9 Claims, 3 Drawing Sheets

Related U.S. Application Data continuation of application No. 13/856,016, filed on Apr. 3, 2013, now Pat. No. 9,443,737.

(51) Int. Cl.

| | | |
|---|---|---|
| *H01L 29/417* | (2006.01) | |
| *H01L 29/45* | (2006.01) | |
| *H01L 29/778* | (2006.01) | |
| *H01L 29/66* | (2006.01) | |
| *H01L 21/283* | (2006.01) | |
| *H01L 29/20* | (2006.01) | |
| *H01L 21/285* | (2006.01) | |

(52) U.S. Cl.
CPC .... *H01L 21/30621* (2013.01); *H01L 29/2003* (2013.01); *H01L 29/41766* (2013.01); *H01L 29/452* (2013.01)

(56) References Cited

U.S. PATENT DOCUMENTS

| | | |
|---|---|---|
| 8,304,271 B2 | 11/2012 | Huang et al. |
| 8,900,939 B2 | 12/2014 | Kub et al. |
| 9,299,822 B2 | 3/2016 | Kikkawa |
| 9,425,301 B2 | 8/2016 | Chiu et al. |
| 9,443,737 B2 | 9/2016 | Kondo et al. |
| 9,818,839 B2 * | 11/2017 | Kondo ............... H01L 21/283 |
| 2005/0236365 A1 | 10/2005 | Komatani |
| 2006/0046512 A1 | 3/2006 | Nakamura et al. |
| 2009/0212324 A1 | 8/2009 | Tamai et al. |
| 2009/0267078 A1 | 10/2009 | Mishra et al. |
| 2010/0155899 A1 | 6/2010 | Horie |
| 2010/0304570 A1 | 12/2010 | Horie et al. |
| 2010/0327322 A1 | 12/2010 | Kub et al. |
| 2011/0272742 A1 | 11/2011 | Akiyama et al. |
| 2012/0139038 A1 | 6/2012 | Imanishi et al. |
| 2012/0146046 A1 | 6/2012 | Ohki et al. |
| 2012/0168894 A1 | 7/2012 | Kim et al. |
| 2013/0082278 A1 | 4/2013 | Mizuno |
| 2013/0099277 A1 * | 4/2013 | Speck ............... H01L 21/30621 257/101 |
| 2013/0161698 A1 | 6/2013 | Marino et al. |
| 2013/0234146 A1 | 9/2013 | Prechtl |
| 2014/0091365 A1 | 4/2014 | Kikkawa et al. |
| 2014/0159119 A1 | 6/2014 | Derluyn et al. |
| 2014/0167111 A1 | 6/2014 | Ahn et al. |
| 2014/0302672 A1 | 10/2014 | Kondo et al. |
| 2014/0302673 A1 | 10/2014 | Kondo et al. |
| 2014/0353720 A1 | 12/2014 | Inoue et al. |
| 2015/0145004 A1 | 5/2015 | Inoue et al. |
| 2015/0311084 A1 | 10/2015 | Moore et al. |
| 2016/0351685 A1 | 12/2016 | Kondo et al. |
| 2018/0033865 A1 * | 2/2018 | Kondo ............... H01L 21/283 |

FOREIGN PATENT DOCUMENTS

| | | | |
|---|---|---|---|
| RU | 20131483 C1 | 3/1995 | |
| WO | 2013010829 A1 | 1/2013 | |
| WO | WO 2014/165638 | * 10/2014 | ........... H01L 29/778 |

OTHER PUBLICATIONS

Buttari, D. et al., "Selective Dry Etching of GaN Over AlGaN in BCl3/SF6 Mixtures", International Journal of High Speed Electronics and Systems, vol. 14, No. 3, 2004, pp. 756-761.

Lee, Hyung-Seok et al., "AlGaN/GaN High-Electron-Mobility Transistors Fabricated Through a Au-Free Technology", IEEE Electron Device Letters, vol. 32, No. 5, 2011, pp. 623-625.

Wang, Liang et al., "Direct Contact Mechanism of Ohmic Metallization to AlGaN/GaN Heterostructures via Ohmic Area Recess Etching", Appl. Phys. Lett. 95, 2009, 172107-1-172107-3.

Singh, Madhusudan et al., "Examination of Tunnel Junctions in the AlGaN/GaN System: Consequences of Polarization Charge", Appl. Phys. Lett., vol. 77, No. 12, 2000, pp. 1867-1869.

* cited by examiner

METHOD OF FORMING METAL CONTACTS IN THE BARRIER LAYER OF A GROUP III-N HEMT

CROSS REFERENCE TO RELATED APPLICATIONS

This application is a divisional of U.S. Nonprovisional patent application Ser. No. 15/237,041, filed Aug. 15, 2016, which is a continuation of U.S. Nonprovisional patent application Ser. No. 13/856,016, filed Apr. 3, 2013 (now U.S. Pat. No. 9,443,737) which is related to U.S. Nonprovisional patent application Ser. No. 13/856,043 (abandoned) for "Method of Forming Metal Contacts with Low Contact Resistances in a Group III-N HEMT" by Yoshikazu Kondo et al., the contents of all of which are herein incorporated by reference in its entirety.

BACKGROUND OF THE INVENTION

1. Field of the Invention

The present invention relates to a method of forming group III-N HEMTs and, more particularly, to a method of forming metal contacts in the barrier layer of a group III-N HEMT.

2. Description of the Related Art

Group III-N high electron mobility transistors (HEMTs) have shown potential superiority for power electronics due to their wider bandgap and high electron saturation velocity. These material properties translate into high breakdown voltage, low on-resistance, and fast switching. Group III-N HEMTs can also operate at higher temperatures than silicon-based transistors. These properties make group III-N HEMTs well suited for high-efficiency power regulation applications, such as lighting and vehicular control.

A conventional group III-N HEMT includes a substrate, and a layered structure that is formed on the top surface of the substrate. The layered structure, in turn, includes a buffer layer that lies on the substrate, a channel layer that lies on the buffer layer, and a barrier layer that lies on the channel layer. Further, the layered structure can optionally include a cap layer that lies on the barrier layer.

The buffer layer provides a transition layer between the substrate and the channel layer in order to address the difference in lattice constant and to provide a dislocation-minimized growing surface. The channel layer and the barrier layer have different polarization properties and band gaps that induce the formation of a two-dimensional electron gas (2DEG) that lies at the top of the channel layer. The 2DEG, which has a high concentration of electrons, is similar to the channel in a conventional field effect transistor (FET). The cap layer enhances the reliability of the group III-N HEMT.

A conventional group III-N HEMT also includes a metal gate that is formed on the top surface of the layered structure. The metal gate makes a Schottky contact to the barrier layer (or the cap layer if present). Alternately, the metal gate can be isolated from the barrier layer (or the cap layer if present) by an insulating layer.

In addition, a conventional group III-N HEMT includes a source metal contact and a drain metal contact that lies spaced apart from the source metal contact. The source and drain metal contacts, which lie in metal contact openings that extend into the layered structure, make ohmic contacts with the barrier layer.

Native group III-N substrates are not easily available. As a result, group III-N HEMTs commonly use a single-crystal silicon substrate. (Silicon carbide is another common substrate material for group III-N HEMTs.) The layered structure is conventionally grown on the substrate using epitaxial deposition techniques such as metal organic chemical vapor deposition (MOCVD) and molecular beam epitaxy (MBE).

Each of the layers in the layered structure is typically implemented with one or more sequential group-III nitride layers, with the group-III including one or more of In, Ga, and Al. For example, the buffer layer can be implemented with sequential layers of AlN (a thermally-stable material), AlGaN, and GaN. In addition, the channel layer is commonly formed from GaN, while the barrier layer is commonly formed from AlGaN. Further, the cap layer can be formed from GaN.

The source and drain metal contacts are conventionally formed by forming a passivation layer, such as a silicon nitride layer, on the top surface of the layered structure (on the top surface of the cap layer if present, or the top surface of the barrier layer when the cap layer is not present). Following this, a patterned photoresist layer is formed on passivation layer.

After the patterned photoresist layer has been formed, the exposed regions of the passivation layer, the underlying portions of the cap layer (if present), and the underlying portions of the barrier layer are dry etched for a predetermined period of time using a gas combination that includes $CHF_3$, $CF_4$, Ar, and $O_2$.

The dry etch forms source and drain metal contact openings that extend through the passivation layer, through the cap layer (if present), and into the barrier layer. It is very difficult to control the depths of the metal contact openings because the etch is very short, typically a few seconds. As a result, the bottom surface of the metal contact openings frequently extends through the barrier layer and into the channel layer.

After this, a metal layer is deposited to lie over the passivation layer and fill up the metal contact openings. The metal layer is then planarized to expose the top surface of the passivation layer and form source and drain metal contacts in the source and drain metal contact openings, respectively.

SUMMARY OF THE INVENTION

The present invention provides a method of forming metal contacts in metal contact openings that expose the barrier layer without exposing the channel layer. The method includes etching a layered structure with a first gas combination to form a number of metal contact openings. The layered structure includes a buffer layer that touches and lies over a substrate, a channel layer that touches and lies over the buffer layer, and a barrier layer that touches and lies over the channel layer. Each of the metal contact openings has a first bottom surface that lies above and spaced apart from a top surface of the channel layer. The method also includes etching the layered structure with a second gas combination to deepen the first bottom surface of each metal contact opening a distance to a second bottom surface that lies below the first bottom surface. The second bottom surface lies above and spaced apart from the top surface of the channel layer.

The present invention also provides an alternate method of forming metal contacts in metal contact openings that expose the barrier layer without exposing the channel layer. The method includes etching a barrier layer with a gas combination that includes boron trichloride ($BCl_3$) and sulfur hexafluoride ($SF_6$) to form a number of metal contact openings. The barrier layer is formed on a channel layer, and includes gallium nitride (GaN). Each of the metal contact openings has a bottom surface that lies above and spaced apart from a top surface of the channel layer. The method also includes etching the barrier layer exposed by the metal contact openings with a gas combination that includes boron trichloride ($BCl_3$) and chlorine ($Cl_2$) to deepen each metal contact opening to a second bottom surface. The second bottom surface lies above and spaced apart from the top surface of the channel layer.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

FIGS. 1-5 show a series of cross-sectional views that illustrate an example of a method 100 of forming a group III-N HEMT in accordance with the present invention. As described in greater detail below, the method of the present invention utilizes a two-step etch process to form metal contact openings in a group III-N HEMT with depths that are easily controlled and do not extend into the channel layer.

Figure 1:
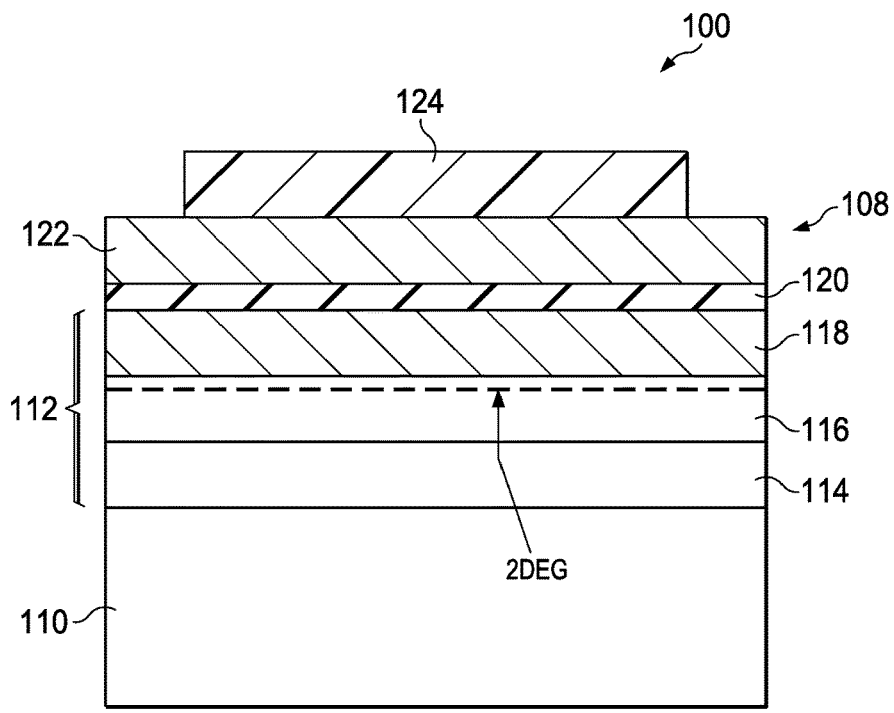
FIGS. 1-5 are a series of cross-sectional views illustrating an example of a method 100 of forming a group III-N HEMT in accordance with the present invention.

As shown in FIG. 1, method 100 utilizes a conventionally-formed group III-N HEMT 108. HEMT 108, in turn, includes a single-crystal, lightly-doped, p-type silicon semiconductor substrate 110 (e.g., <111>), and a layered structure 112 that is formed on the top surface of substrate 110.

Layered structure 112, in turn, includes a buffer layer 114 that touches substrate 110, a channel layer 116 that touches buffer layer 114, and a barrier layer 118 that touches channel layer 116. Further, layered structure 112 can optionally include a cap layer 120 that lies over barrier layer 118.

Buffer layer 114 provides a transition layer between substrate 100 and channel layer 116 as a result of lattice mismatches. Channel layer 116 and barrier layer 118 have different polarization properties and band gaps that induce the formation of a two-dimensional electron gas (2DEG) that lies at the top of channel layer 116. Cap layer 120 provides enhanced reliability.

Each of the layers in layered structure 112 can be implemented with one or more sequential group-III nitride layers, with the group-III including one or more of In, Ga, and Al. For example, buffer layer 114 can be implemented with sequential layers of AlN (a thermally-stable material), AlGaN, and GaN. In addition, channel layer 116 can be formed from GaN, while barrier layer 118 can be formed from AlGaN. Further, cap layer 120 can be formed from GaN.

Further, HEMT 108 includes a passivation layer 122 that touches the top surface of layered structure 112 (on the top surface of cap layer 120 if present, or the top surface of barrier layer 118 when cap layer 120 is not present). Passivation layer 122 can be implemented with, for example, a silicon nitride layer.

As further shown in FIG. 1, method 100 begins by forming a patterned photoresist layer 124 on passivation layer 122. Patterned photoresist layer 124 is formed in conventional manner, which includes depositing a layer of photoresist, projecting a light through a patterned black/clear glass plate known as a mask to form a patterned image on the layer of photoresist to soften the photoresist regions exposed by the light, and removing the softened photoresist regions.

Figure 2:
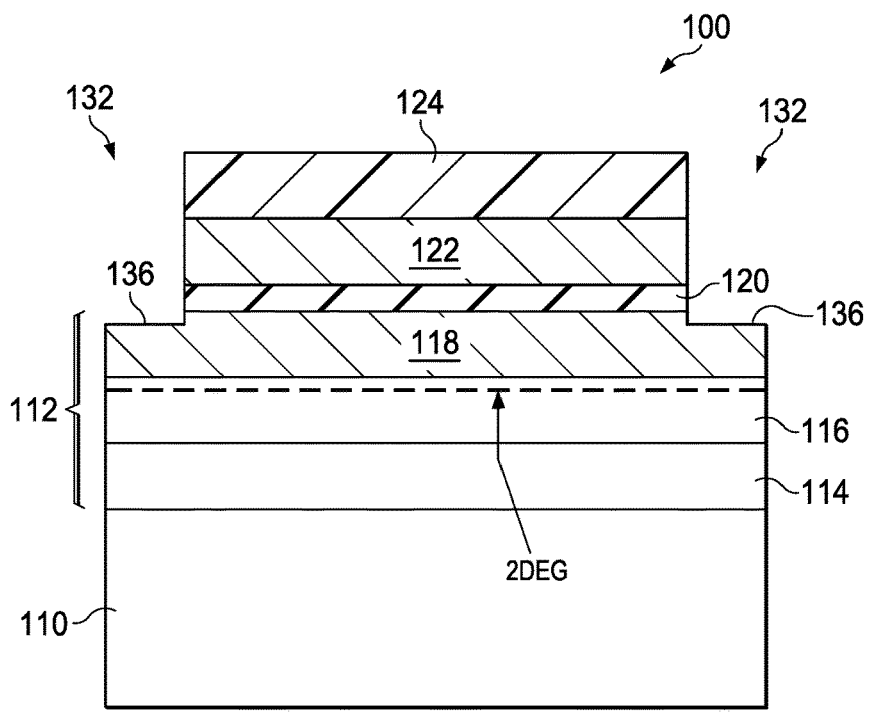

As shown in FIG. 2, after patterned photoresist layer 124 has been formed, the exposed regions of passivation layer 122, the underlying portions of cap layer 120 (when present), and the underlying portions of barrier layer 118 are dry etched using a gas combination that includes boron trichloride ($BCl_3$) and sulfur hexafluoride ($SF_6$) to form source and drain metal contact openings 132.

Each metal contact opening 132 has a bottom surface 136 that lies above and spaced apart from the top surface of channel layer 116. In the present example, the following etch conditions are used:
Pressure: 19 mT-21 mT (preferably 20 mT);
TCP RF: 200 W-400 W (preferably 300 W);
Bias RF: 47.5 W-52.5 W (preferably 50 W);
$BCl_3$: 20 ccm-30 ccm (preferably 25 ccm);
$SF_6$: 45 ccm-65 ccm (preferably 55 ccm);
He Clamp: 5 T-10 T (preferably 6 T); and
Temp: 45 deg C.-65 deg C. (preferably 55 C).

The $BCl_3$ and $SF_6$ gas combination under the above conditions etches down into barrier layer 118 for a period of time, but then etches substantially no deeper into barrier layer 118 after the period of time. For example, the $BCl_3$ and $SF_6$ gas combination under the above preferred conditions etches down into an AlGaN barrier layer 118 a distance of approximately 43 Å during an etch time of 65 seconds.

However, from 65 seconds to 200 seconds, the $BCl_3$ and $SF_6$ gas combination etches substantially no deeper into the AlGaN barrier layer 118. Thus, barrier layer 118 is etched with the $BCl_3$ and $SF_6$ gas combination for a predefined time that is equal to or greater than the period of time.

Figure 3:
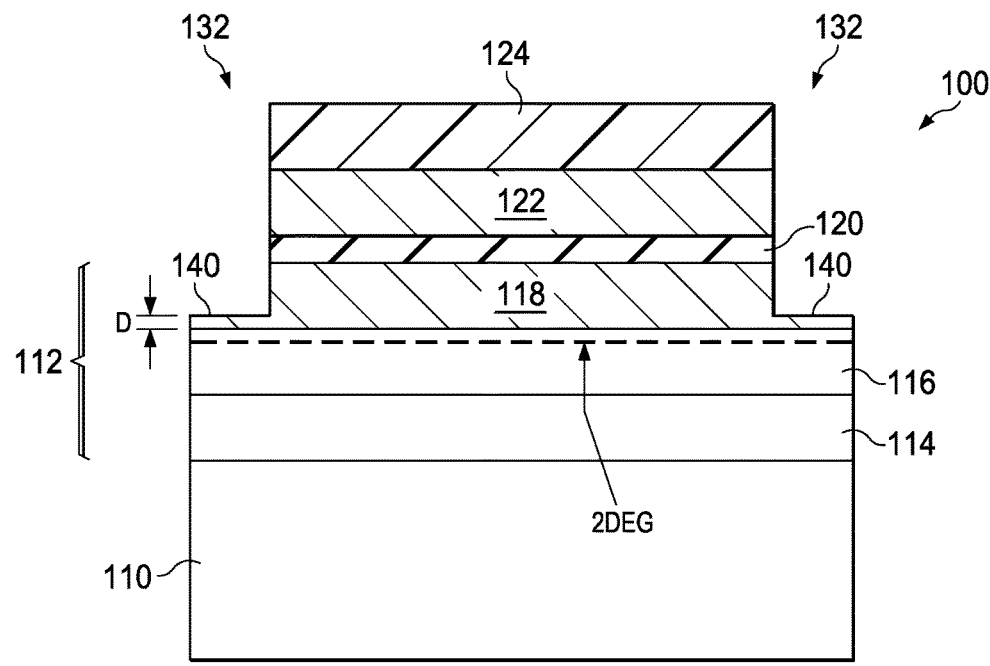

As shown in FIG. 3, after the $BCl_3$ and $SF_6$ etch, the gas is changed and the regions of barrier layer 118 exposed by the metal contact openings 132 are dry etched for a predetermined period of time using a gas combination that includes $BCl_3$ and $CL_2$ to deepen each bottom surface 136 to a lower bottom surface 140. In the present example, the $BCl_3$ and $CL_2$ gas combination etches more of barrier layer 118 than does the $BCl_3$ and $SF_6$ gas combination.

Each lower bottom surface 140 lies above and spaced apart from the top surface of channel layer 116 by a separation distance D. After the etch, patterned photoresist layer 124 is removed in a conventional manner, such as with an ash process. In the present example, the following etch conditions are used:
Pressure: 14 mT-16 mT (preferably 15 mT);
TCP RF: 200 W-400 W (preferably 300 W);
Bias RF: 8 W-12 W (preferably 10 W);
$BCl_3$: 70 ccm-90 ccm (preferably 80 ccm);
$Cl_2$: 10 ccm-30 ccm (preferably 20 ccm);
He Clamp: 5 T-10 T (preferably 6 T); and
Temp: 45 deg C.-65 deg C. (preferably 55 C).

The $BCl_3$ and $CL_2$ gas combination under the above conditions further etches down into barrier layer 118 at a (slow) rate of approximately 1.05 Å/s. Since the initial depths of the metal contact openings 132 in barrier layer 118 are each approximately 43 Å, and since the $BCl_3$ and $CL_2$ gas etches down into barrier layer 118 at a rate of approximately 1.05 Å/s, the final depths of the metal contact openings 132 can be easily controlled.

For example, if barrier layer 118 is 180 Å thick and 43 Å of barrier layer 118 have been removed by the $BCl_3$ and $SF_6$ etch, then the $BCl_3$ and $CL_2$ etch requires approximately 101.9 seconds at a rate of approximately 1.05 Å/s to extend each metal contact opening 132 down another 107 Å into barrier layer 118, thereby forming the lower bottom surfaces 140 to be 150 Å deep in barrier layer 118 and leaving a 30 Å separation distance D.

An approximate etch time of 101.9 seconds is substantially longer than the few etch seconds available in the prior art, thereby allowing easy control of the depths of the metal contact openings 132. As a result, one of the advantages of the present invention is that the depths of the source and drain metal contact openings 132 can be easily controlled and prevented from exposing or extending into channel layer 116.

Figure 4:
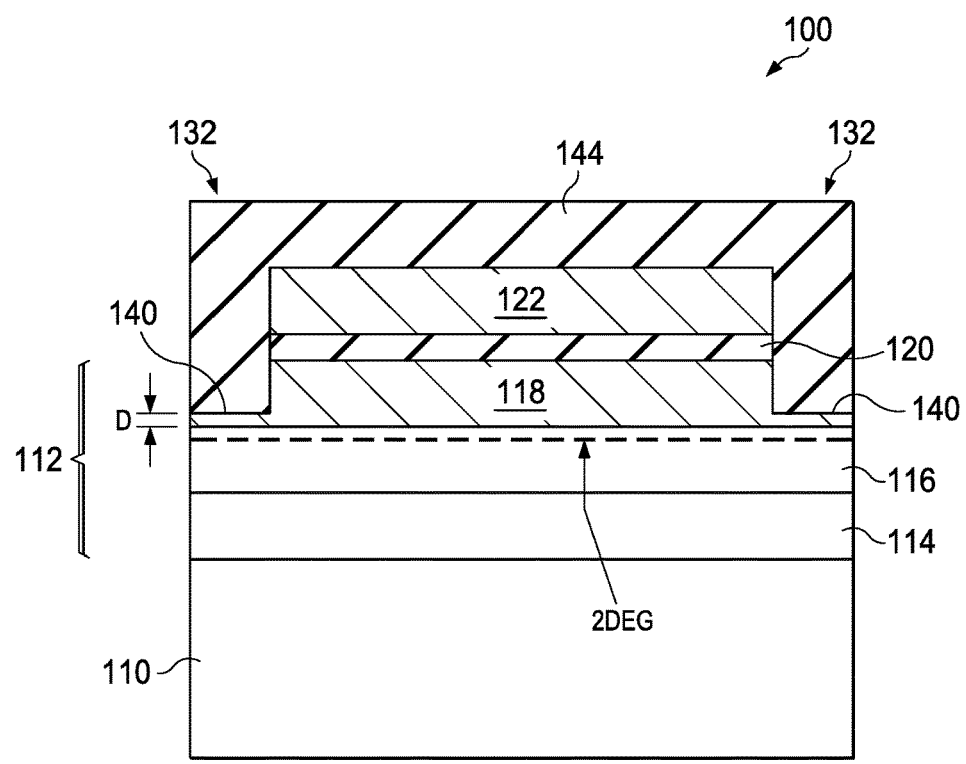

As shown in FIG. 4, after the source and drain metal contact openings 132 have been deepened to the lower bottom surfaces 140, a metal layer 144 is deposited to touch the top surface of passivation layer 122 and fill up the metal contact openings 132 in barrier layer 118, cap layer 120, and passivation layer 122. Metal layer 144 is free of gold, and can include, for example, a titanium layer, an aluminum copper layer (0.5% Cu) that touches and lies over the titanium layer, and a titanium nitride cap that touches and lies over the aluminum copper layer.

Figure 5:
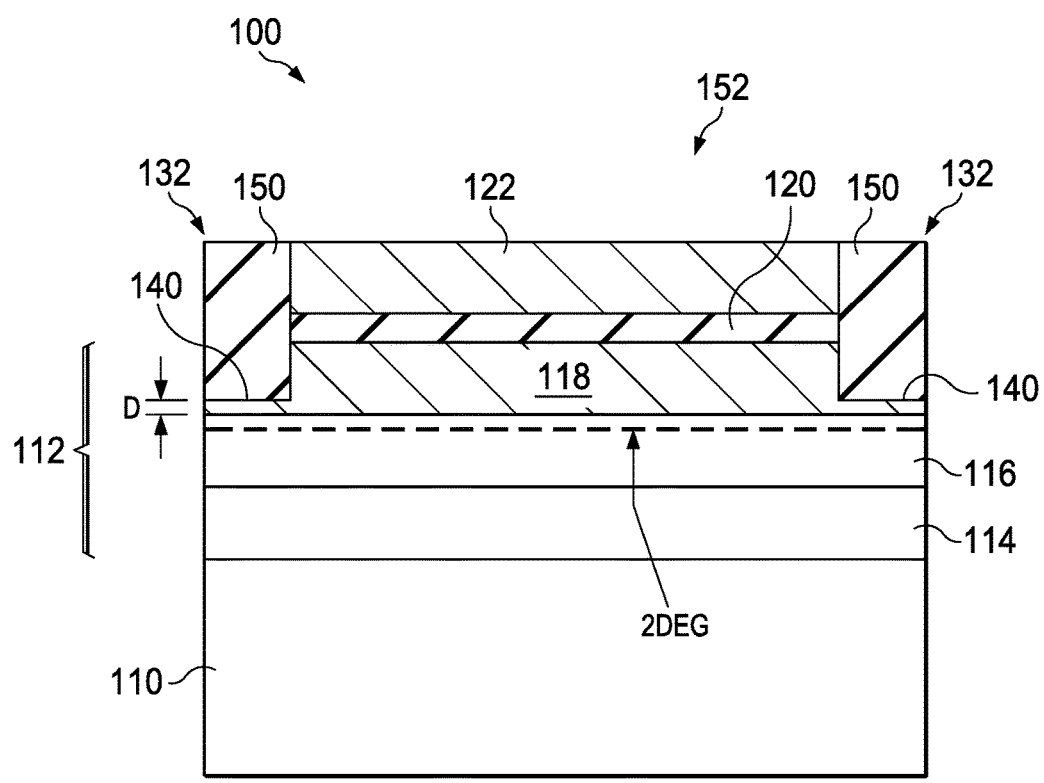

As shown in FIG. 5, after metal layer 144 has been formed, metal layer 144 is planarized in a conventional manner, such as with chemical-mechanical polishing, to expose the top surface of passivation layer 122. The planarization forms source and drain metal contacts 150 in the source and drain metal contact openings 132, respectively. The planarization also forms a group III-N HEMT structure 152. The metal contacts 150, which are free of gold, make ohmic connections to barrier layer 118. Method 100 then continues with conventional steps to complete the formation of a packaged group III-N HEMT.

It should be understood that the above descriptions are examples of the present invention, and that various alternatives of the invention described herein may be employed in practicing the invention. For example, group III-N HEMTs are conventionally formed as depletion-mode devices, but can also be formed as enhancement-mode devices.

The present invention applies equally well to enhancement-mode devices as the substrate and buffer layer structures of these devices are the same. Therefore, it is intended that the following claims define the scope of the invention and that structures and methods within the scope of these claims and their equivalents be covered thereby.

What is claimed is:

1. A method of forming a high electron mobility transistor comprising:
    forming a channel layer over a substrate;
    forming a barrier layer over the channel layer, the barrier layer including a GaN material;
    etching the GaN material of the barrier layer with a gas combination that includes boron trichloride ($BCl_3$) and sulfur hexafluoride ($SF_6$) to form a number of metal contact openings, each of the metal contact openings having a bottom surface that lies above and spaced apart from a top surface of the channel layer; and
    etching the GaN material of the barrier layer exposed by the metal contact openings with a gas combination that includes boron trichloride ($BCl_3$) and chlorine ($Cl_2$) to deepen each metal contact opening to a second bottom surface, the second bottom surface lying above and spaced apart from the top surface of the channel layer.

2. The method of claim 1, further comprising depositing a metal contact layer that contacts each second bottom surface and fills the metal contact openings.

3. The method of claim 2, further comprising planarizing the metal contact layer to form a number of spaced-apart metal contacts that lie in the number of metal contact openings.

4. The method of claim 1, wherein the gas combination that includes $BCl_3$ and $SF_6$ also etches through a cap layer over the barrier layer, and through a passivation layer over the cap layer.

5. The method of claim 4, wherein the cap layer includes GaN and the passivation layer includes silicon nitride.

6. The method of claim 1, wherein the gas combination that includes $BCl_3$ and $SF_6$ also etches through a passivation layer over the barrier layer.

7. The method of claim 6, wherein the passivation layer includes silicon nitride.

8. The method of claim 1, wherein the channel layer includes GaN.

9. The method of claim 1, wherein the GaN material of the barrier layer is AlGaN.

* * * * *